(12) United States Patent
Deguchi

(10) Patent No.: US 7,049,221 B2
(45) Date of Patent: May 23, 2006

(54) METHOD FOR MANUFACTURING A SEMICONDUCTOR DEVICE HAVING A MULTILAYER INTERCONNECTION STRUCTURE

(75) Inventor: Takatoshi Deguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/695,666

(22) Filed: Oct. 29, 2003

(65) Prior Publication Data
US 2004/0137711 A1    Jul. 15, 2004

(30) Foreign Application Priority Data
Oct. 30, 2002   (JP)   ............... 2002-316384

(51) Int. Cl.
*H01L 21/4763* (2006.01)

(52) U.S. Cl. ..................... 438/622; 438/638

(58) Field of Classification Search ............... 438/638, 438/633, 624, 724, 622, 725
See application file for complete search history.

(56) References Cited

U.S. PATENT DOCUMENTS

| | | | |
|---|---|---|---|
| 6,051,508 A * | 4/2000 | Takase et al. | 438/724 |
| 6,153,511 A | 11/2000 | Watatani | 438/623 |
| 6,242,344 B1 | 6/2001 | Koh et al. | |
| 6,337,519 B1 | 1/2002 | Watatani | 257/759 |
| 6,465,157 B1 | 10/2002 | Li et al. | |
| 6,514,878 B1 | 2/2003 | Watatani | 438/769 |
| 6,720,249 B1 * | 4/2004 | Dalton et al. | 438/624 |
| 2002/0039840 A1 | 4/2002 | Watatani | 438/702 |
| 2003/0119305 A1 * | 6/2003 | Huang et al. | 438/633 |
| 2004/0023497 A1 * | 2/2004 | Pan et al. | 438/694 |

FOREIGN PATENT DOCUMENTS

| | | |
|---|---|---|
| JP | 2000-124306 A | 4/2000 |
| JP | 2001-351976 | 12/2001 |
| JP | 2001-351976 A | 12/2001 |

OTHER PUBLICATIONS

Taiwan Office Action for Taiwan Application No. 92130060, dated Jan. 14, 2005.
Office Action from Taiwanese Patent Office received on Sep. 29, 2004, with English language translation.

* cited by examiner

*Primary Examiner*—Carl Whitehead, Jr.
*Assistant Examiner*—Heather Doty
(74) *Attorney, Agent, or Firm*—Westerman, Hattori, Daniels & Adrian, LLP

(57) ABSTRACT

After forming an $Si_3N_4$ film as a hard mask for a wiring, a lower resin film for filling and planarizing a level difference thereon is formed. Next, an SOG film is formed on the lower resin film, and a resist mask on which a via hole pattern is formed is formed thereon. The SOG film is etched by using the resist mask as a mask. The lower resin film is etched by using the SOG film as a mask, and at the same time, the resist mask is removed. Then, a triple layer hard mask is etched by using the lower resin film as a mask. Consequently, a via hole pattern is formed on these films, and the SOG film is simultaneously removed. According to this method, the resist mask having a pattern as designed can be obtained, and a micro pattern with high precision can be obtained.

17 Claims, 6 Drawing Sheets

METHOD FOR MANUFACTURING A SEMICONDUCTOR DEVICE HAVING A MULTILAYER INTERCONNECTION STRUCTURE

CROSS-REFERENCE TO RELATED APPLICATIONS

This application is based upon and claims the benefit of priority from the prior Japanese Patent Application No. 2002-316384, filed on Oct. 30, 2002, the entire contents of which are incorporated herein by reference.

BACKGROUND OF THE INVENTION

1. Field of the Invention

The present invention relates to a method for manufacturing a semiconductor device for which a dual damascene method is adopted.

2. Description of the Related Art

With the recent progress of high-density design of a semiconductor integrated circuit, density of a wiring pattern has increased, and a wiring has become longer. Al was conventionally used for a wiring material; however, wiring delay has come up as a problem with the miniaturization of the wiring pattern. Recently, Cu is mainly used as the wiring material in order to solve the problem. However, it is difficult to transfer the wiring pattern on the Cu itself unlike the Al. Therefore, when a Cu wiring is formed, a damascene method for transferring a wiring trench pattern on an interlayer dielectric and for forming the wiring pattern thereon by embedding the Cu is effective. Furthermore, the damascene method is classified into a single damascene method for separately forming the Cu in a trench and the Cu in a via, and a dual damascene method for simultaneously forming the trench and the via.

Meanwhile, in order to solve the problem of the wiring delay, a low dielectric constant film having lower dielectric constant than a conventional oxide film is used as a material for the interlayer dielectric. The material of the low dielectric constant film is classified broadly into two kinds: an inorganic material and an organic material. Generally, they are used appropriately in order to satisfy a demand of characteristics of each device.

A Cu dual damascene method is preferably used for configuring a wiring layer of a semiconductor device in a generation of 130 nm nodes and below. Furthermore, when an organic low dielectric constant film is used as the interlayer dielectric, a trench-first hard mask method is generally used for an interlayer structure. Here, the trench-first hard mask method means a method for forming a hard mask pattern for forming the wiring trench pattern on the interlayer dielectric in advance, then patterning the via directly on a level difference of the wiring trench pattern, and then processing the via and processing the trench in the interlayer dielectric in this order, thereby forming a dual damascene structure.

Prior arts are described in Japanese Patent Laid-open No. 2001-351976 and Japanese Patent Laid-open No. 2000-124306.

An ArF excimer laser is generally used for exposing the via pattern in the generation of 100 nm nodes and below. However, with the miniaturization of the pattern, an error of the pattern formed by the ArF excimer laser has become beyond the limit of what is acceptable.

SUMMARY OF THE INVENTION

The present invention was invented in consideration of the above-mentioned problems. It is an object of the present invention to provide a method for manufacturing a semiconductor device which makes it possible to appropriately form a micro pattern on an interlayer dielectric by a dual damascene method.

After extremely careful consideration, inventors of the present invention found out that a depth of focus inevitably had become shallow in order to form the micro pattern and that the depth had been extremely sensitive to planarity of a base when an ArF excimer laser technology had been used. The inventors also found out that, on the contrary, an error had occurred on the pattern formed on a photoresist by lithography due to poor planarity thereof when a conventional method had been adopted. Furthermore, the error was particularly remarkable in the generation of 100 nm or below.

Accordingly, when a via hole is formed by using a trench-first hard mask method, and further, by using the ArF excimer laser technology, patterning for forming the via hole is required after embedding a level difference of a mask (a hard mask) for a wiring trench. A multilayered resist technology is effective for planarizing the level difference and patterning thereof. The multilayered resist technology includes, for example, a tri-level technology for which a multilayered resist composed of a triple layer laminated film is used, and a bi-level resist technology for which a multilayered resist composed of a double layer laminated film is used. Consequently, the inventors of the present invention made up following aspects of the invention based on the above-mentioned views.

The method for manufacturing the semiconductor device relating to the present invention relates to the method for manufacturing the semiconductor device for forming a wiring by a dual damascene method. According to the manufacturing method, a mask for a wiring trench is first formed on an interlayer dielectric film, and a mask for a via hole is formed on the mask for the wiring trench by using the multilayered resist, A hole shallower than a thickness of the interlayer dielectric film is formed in the interlayer dielectric by processing the interlayer dielectric film, using the mask for the via hole. Next, a wiring trench is formed in the interlayer dielectric by processing the interlayer dielectric film, using the mask for the wiring trench, and simultaneously, the via hole is formed by passing the hole through a base layer. Then, a wiring material is embedded in the wiring trench and the via hole.

A step of removing the multilayered resist is required when using the multilayered resist technology. However, according to the conventional method, in the case where an organic low dielectric constant film is used as the interlayer dielectric film, when the multilayered resist is removed after etching, there is a possibility that a shape of the pattern formed on the low dielectric constant film may be damaged. Therefore, it is desirable that a thickness and a material of respective films which compose the multilayered resist and hard masks should be also appropriately selected.

DETAILED DESCRIPTION OF THE PREFERRED EMBODIMENTS

A specific explanation of a method for manufacturing a semiconductor device relating to embodiments of the present invention is given hereinafter with reference to the attached drawings, in which a wafer whose diameter is 200 mm is used, for example.

First Embodiment

Figure 1A:
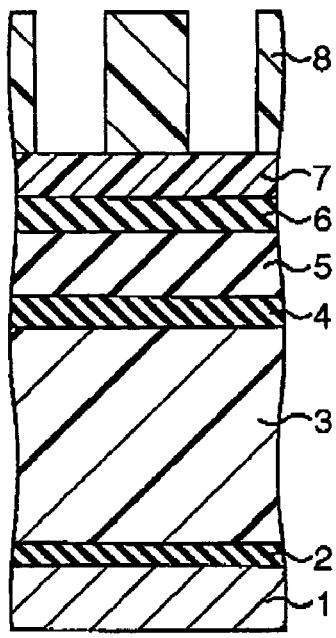
FIG. 1A to FIG. 1O are cross-sectional views showing a method for manufacturing a semiconductor device in order of processes relating to a first embodiment of the present invention.

A first embodiment of the present invention is explained here. FIG. 1A to FIG. 1O are cross-sectional views showing the method for manufacturing the semiconductor device in order of processes relating to the first embodiment of the present invention. In the embodiment, the semiconductor device is manufactured by a trench-first hard mask dual damascene method.

As shown in FIG. 1A, an SiC film 2 is first formed on a Cu wiring 1 as an etching stopper layer The siC film 2 is, for example, 30 nm thick. Then, an organic low dielectric constant film 3 is formed on the SiC film 2 as an interlayer dielectric. The organic low dielectric constant film 3 is, for example, 450 nm thick. For example, SiLK (registered trademark) manufactured by the Dow Chemical Company, an organic SOG, amorphous carbon fluoride, and polytetrafluoroethylene (Teflon (registered trademark of DuPont Company) and the like may be used as ingredients of the organic low dielectric constant film 3.

An SiC film 4 is formed on the organic low dielectric constant film 3 as a first hard mask, and further, an $SiO_2$ film 5 is formed on the SiC film 4 as a second hard mask. The SiC film 4 and the $SiO_2$ film 5 are, for example, 50 nm and 100 nm thick, respectively. Then, an $Si_3N_4$ film 6 is formed on the $SiO_2$ film 5 as a third hard mask. The $Si_3N_4$ film 6 is a film to be etched when a hard mask pattern of a wiring trench is formed. The $Si_3N_4$ film 6 is, for example, 50 nm thick. After this, an organic BARC (Bottom anti-reflection coating) 7 is formed on the $Si_3N_4$ film 6 as an anti-reflection film required for patterning. The organic BARC 7 is, for example, 87 nm thick. A resist mask 8 on which a wiring trench pattern is formed is formed on the organic BARC 7 by applying an organic photoresist thereon, exposing and developing it. The resist mask 8 is, for example, 300 nm thick.

Note that materials of the first to the third hard mask are not particularly limited, and following inorganic materials can be used: silicon nitride, silicon dioxide, silicon carbide, amorphous hydrogenated silicon carbide, silicon carbide nitride, organo-silicate glass, silicon rich oxide, tetraethylorthosilicate, phosphosilicate, organic siloxane polymer, carbon doped silicate glass, hydrogen doped silicate glass, silsesquioxane glass, spin-on glass, fluorinated silicate glass, and so forth.

Figure 1B:
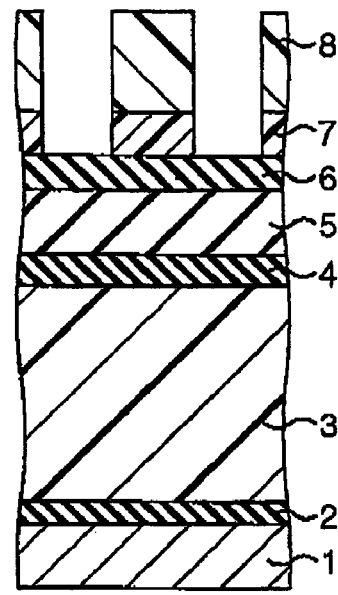

Next, as shown in FIG. 1B, the organic BARC 7 is etched by using the resist mask 8 as a mask. This etching is carried out by plasma etching equipment under the following conditions: for example, $CF_4$: 0–200 sccm, Ar: 0–1000 sccm, $O_2$: 0–100 sccm, pressure: 0.13–40 Pa (1–300 mtorr), RF power: 100–1000 W, magnetic field: 0–10 mT (0–100 G).

Figure 1C:
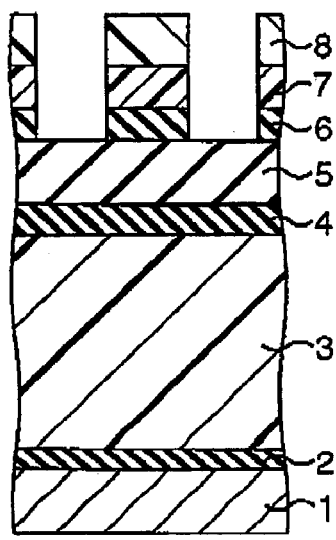

Then, as shown in FIG. 1C, the $Si_3N_4$ film 6 is etched by using the resist mask 8 and the organic BARC 7 as a mask. This etching is carried out by the plasma etching equipment under the following conditions: $CF_4$: 0–200 sccm, Ar: 0–1000 SCcm, $O_2$: 0–100 sccm, pressure: 0.13–40 Pa (1–300 mTorr), RF power: 100–1000 W, magnetic field: 0–10 mT (0–100 G). Consequently, the $Si_3N_4$ film 6 is patterned to be wiring trench patterns.

Figure 1D:
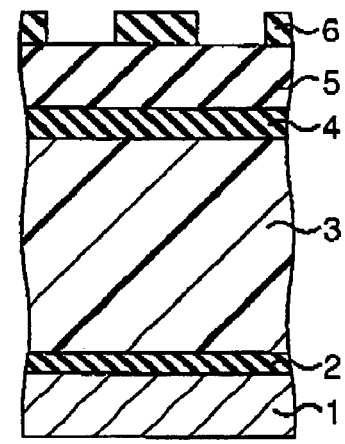

Thereafter, as can be seen in FIG. 1D, the resist mask 8 and the organic BARC 7 are removed by ashing. This ashing is carried out by plasma ashing equipment under the following conditions: for example, $O_2$: 0–100 sccm, pressure: 0.13–67 Pa (1–500 mTorr), RF power: 100–1000 W.

Next, a via hole pattern is formed on the organic low dielectric constant film 3 or the like which is the interlayer dielectric. Here, a tri-level technology is used for the wiring trench pattern formed on the $Si_3N_4$ film 6.

Figure 1E:
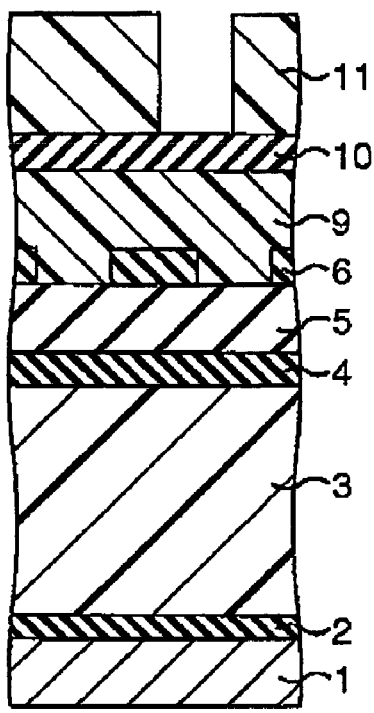

Specifically, as shown in FIG. 1E, a lower resin film (an organic film) 9 for filling and planarizing level differences on the $Si_3N_4$ film 6 is formed. The lower resin film 9 is thinner than the organic low dielectric constant film 3, and for example, between 100 nm and 400 nm thick, 300 nm thick in the embodiment, when the organic low dielectric constant film 3 is between 100 nm and 600 nm thick. Next, an SOG (spin-on glass) film (an inorganic film) 10 used as a mask when the lower resin film 9 is etched is formed on the lower resin film 9. A thickness of the SOG film 10 is thinner than a total film thickness of the SiC film 4, the $SiO_2$ film 5, and the $Si_3N_4$ film 6, and, for example, between 30 nm and 200 nm thick, 86 nm thick in the embodiment. A resist mask (a photoresist layer) 11 on which a via hole pattern is formed is formed on the SOG film 10 by applying the organic photoresist thereon, exposing and developing it. A thickness of the resist mask 11 is approximately equal with that of the lower resin film 9, and, for example, between 100 nm and 0.300 nm thick, 300 nm thick in this embodiment.

Incidentally, as the photoresist, for example, a material exposed by a KrF laser (wavelength: 248 nm), a material exposed by an ArF laser (wavelength; 193 nm), a material exposed by an F2 laser (wavelength: 157 nm), a material exposed by an electron beam, and the like may be used.

Furthermore, for example, SOG materials such as organosilicate glass, organic siloxane polymer, and the like can be used as ingredients of the SOG film 10, and, for example, an applied-type organic resin material can be used as an ingredient of the lower resin film 9.

Figure 1F:
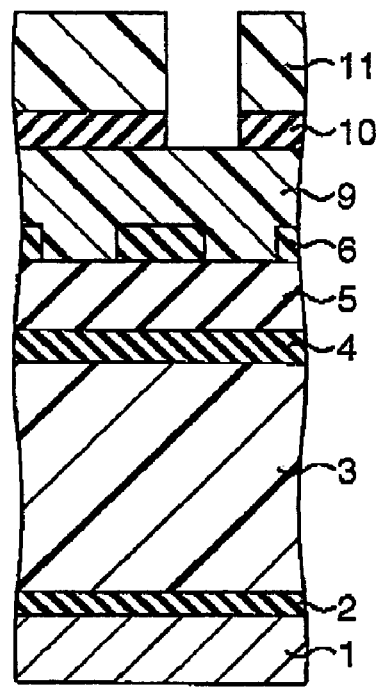

Then, as shown in FIG. 1F, the SOG film 10 is etched by using the resist mask 11 as a mask. This etching is carried out by the plasma etching equipment under the following conditions: for example, $CF_4$: 0–200 sccm, Ar: 0–1000 sccm, $O_2$: 0–100 sccm, pressure: 0.13–40 Pa (1–300 mTorr), RF power; 100–1000 W, magnetic field: 0–10 mT (0–100 G).

Figure 1G:
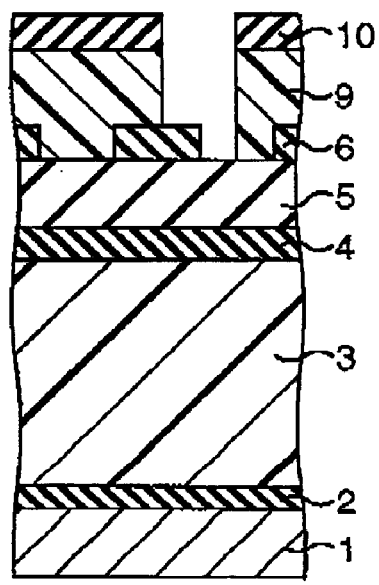

Thereafter, as shown in FIG. 1G, the lower resin film 9 is etched by using the SOG film 10 as a mask, and at the same time, the resist mask 11 is removed. This etching is carried out by the plasma etching equipment under the following conditions: for example, $NH_3$: 1–500 sccm, pressure: 0.13–40 Pa (1–300 mTorr), RF power: 100–1000 W, magnetic field: 0–10 mT (0–100 G). Etching selectivity therebetween is approximately 1 in this etching because the lower resin film 9 is organic as well as the resist mask 11. Therefore, if a film thickness of the resist mask 11 is extremely thicker than that of the lower resin film 9, the resist mask 11 may remain on the SOG film 10 when the etching of the lower resin film 9 is completed. Therefore, the film thickness of the resist mask 11 is preferably equal with or below that of the lower resin film 9.

Figure 1H:
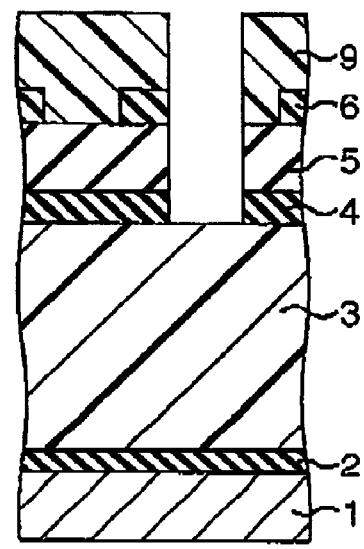

Next, as can be seen in FIG. 1H, the $Si_3N_4$ film 6, the $SiO_2$ film 5, and the SiC film 4 (a triple layer hard mask) are etched by using the lower resin film 9 as a mask. Consequently, a via hole pattern is formed on these films, and the SOG film 10 is simultaneously removed. This etching is carried out by the plasma etching equipment under the following conditions: for example, $CF_4$: 0–200 sccm, Ar: 0–1000 sccm, $O_2$: 0–100 sccm, pressure: 0.13–40 Pa (1–300 mTorr), RF power: 100–1000 W, magnetic field: 0–10 mT (0–100 G). The SOG film 10 is simultaneously removed during this etching by adopting a condition that etching selectivity between the SOG film 10 and the triple layer hard mask is approximately 1. Therefore, if a film thickness of the SOG film 10 is extremely thicker than the total film thickness of the triple layer hard mask, the SOG film 10 may remain when etching of the triple layer hard mask is completed. Accordingly, the film thickness of the SOG film 10 is preferably equal with or below the total film thickness of the $Si_3N_4$ film 6, the $SiO_2$ film 5, and the SiC film 4.

Figure 1I:
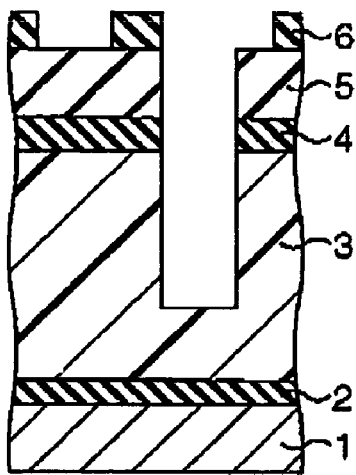

Thereafter, as shown in FIG. 1I, the organic low dielectric constant film 3 is etched to the extent of 200 nm to 400 nm by using the triple layer hard mask as a mask, and at the same time, the lower resin film 9 is removed. This etching is carried out by the plasma etching equipment under the following conditions: for example, $NH_3$: 1–500 sccm, pressure: 0.13–40 Pa (1–300 mTorr), RF power: 100–1000 W, magnetic field: 0–10 mT (0–100 G). A hole formed in the organic low dielectric constant film 3 by this etching is a part of a via hole.

Figure 1J:
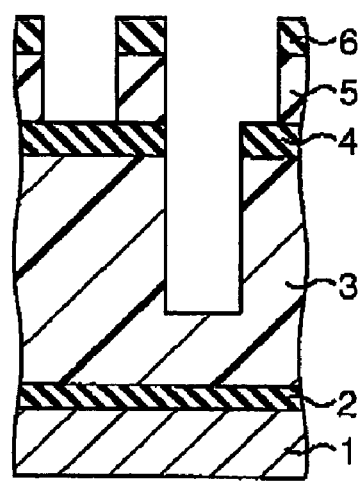

After this, the $SiO_2$ film 5 is etched by using the $Si_3N_4$ film 6 exposed by the removal of the lower resin film 9 as a mask. Consequently, as shown in FIG. 1J, a wiring trench pattern is also formed on the $SiO_2$ film 5. This etching is carried out by the plasma etching equipment under the following conditions: for example, $C_4F_6$: 1–100 sccm, Ar: 1–500 sccm, $O_2$: 1–100 sccm, pressure: 0.13–40 Pa (1–300 mTorr), RF power: 100–2000 W, magnetic field: 0–10 mT (0–100 G).

Figure 1K:
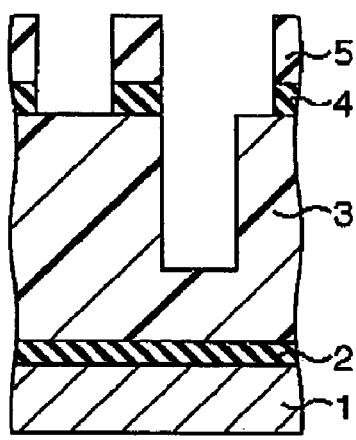

Next, the SiC film 4 is etched by using the $Si_3N_4$ film 6 and the $SiO_2$ film 5 as a mask. As a result, as can be seen in FIG. 1K, a wiring trench pattern is also formed on the SiC film 4, and at the same time, the $Si_3N_4$ film 6 is removed. This etching is carried out by the plasma etching equipment under the following conditions: for example, $CHF_3$: 0–100 sccm, $CH_2F_2$: 0–100 sccm, $N_2$: 1–500 sccm, $O_2$: 1–100 sccm, pressure: 0.13–40 Pa (1–300 mTorr), RF power: 100–2000 W, magnetic field: 0–10 mT (0–100 G).

Figure 1L:
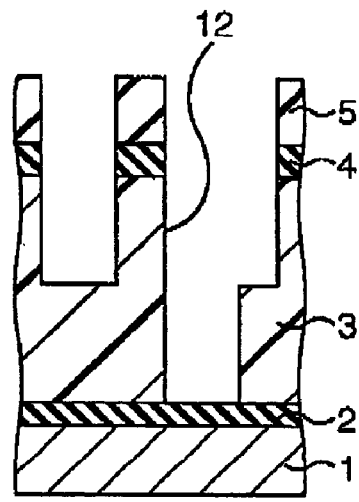

Then, the organic low dielectric constant film 3 which is the interlayer dielectric is etched by using the $SiO_2$ film 5 and the SiC film 4 as a mask; consequently, as shown in FIG. 1L, a wiring trench 12 whose depth is approximately 200 nm is formed. Simultaneously, a hole which reaches the SiC film 2 is formed. This etching is carried out by the plasma etching equipment under the following conditions: for example, $NH_3$: 1–500 sccm, $H_2$: 0–500 sccm, Ar: 0–500 sccm, pressure: 0.13–133 Pa (1–1000 mTorr), RF power: 100–1000 W, magnetic field: 0–10 mT (0–100 G).

Note that, in this process, the depth of the wiring trench is to be approximately 200 nm. Therefore, if the depth of the hole is too shallow during the process shown in FIG. 1I, for example, 250 nm or below, there is a possibility that the hole may not reach the SiC film 2 during this process.

Figure 1M:
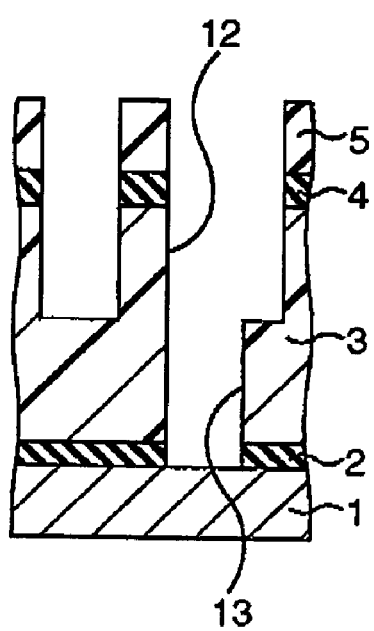

Then, the SIC film 2 is etched by using the $SiO_2$ film 5, the SiC film 4, and the organic low dielectric constant film 3 as a mask; consequently, a via hole 13 which reaches the Cu wiring 1 is formed therein, as can be seen in FIG. 1M. As a result, a shape of dual damascene is completed. This etching is carried out by the plasma etching equipment under the following conditions: for example, $CHF_3$: 0–100 sccm, $CH_2F_2$: 0–100 sccm, $N_2$: 1–500 sccm, $O_2$: 1–100 sccm, pressure; 1–300 mTorr, RF power: 100–2000 W, magnetic field: 0–100 G.

Thereafter, the via hole 13 and the wiring trench 12 are cleaned with proper solvent, and proper barrier metal is deposited therein.

Figure 1N:
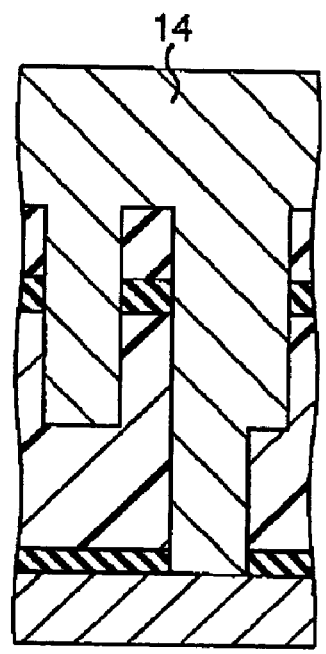
Figure 1O:
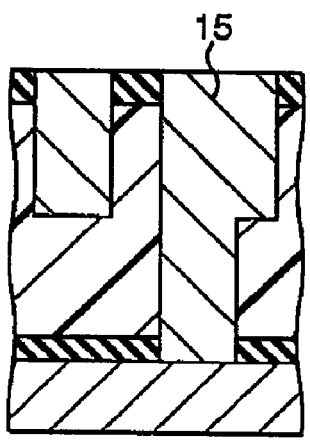

Thereafter, a Cu wiring 15 is formed by embedding Cu 14 in the via hole 13 and the wiring trench 12 as shown in FIG. 1N, and planarizing the Cu 14 by CMP as shown in FIG. 1O. The semiconductor device is completed by forming other interlayer dielectrics, wirings, and the like as necessary.

Figure 2:
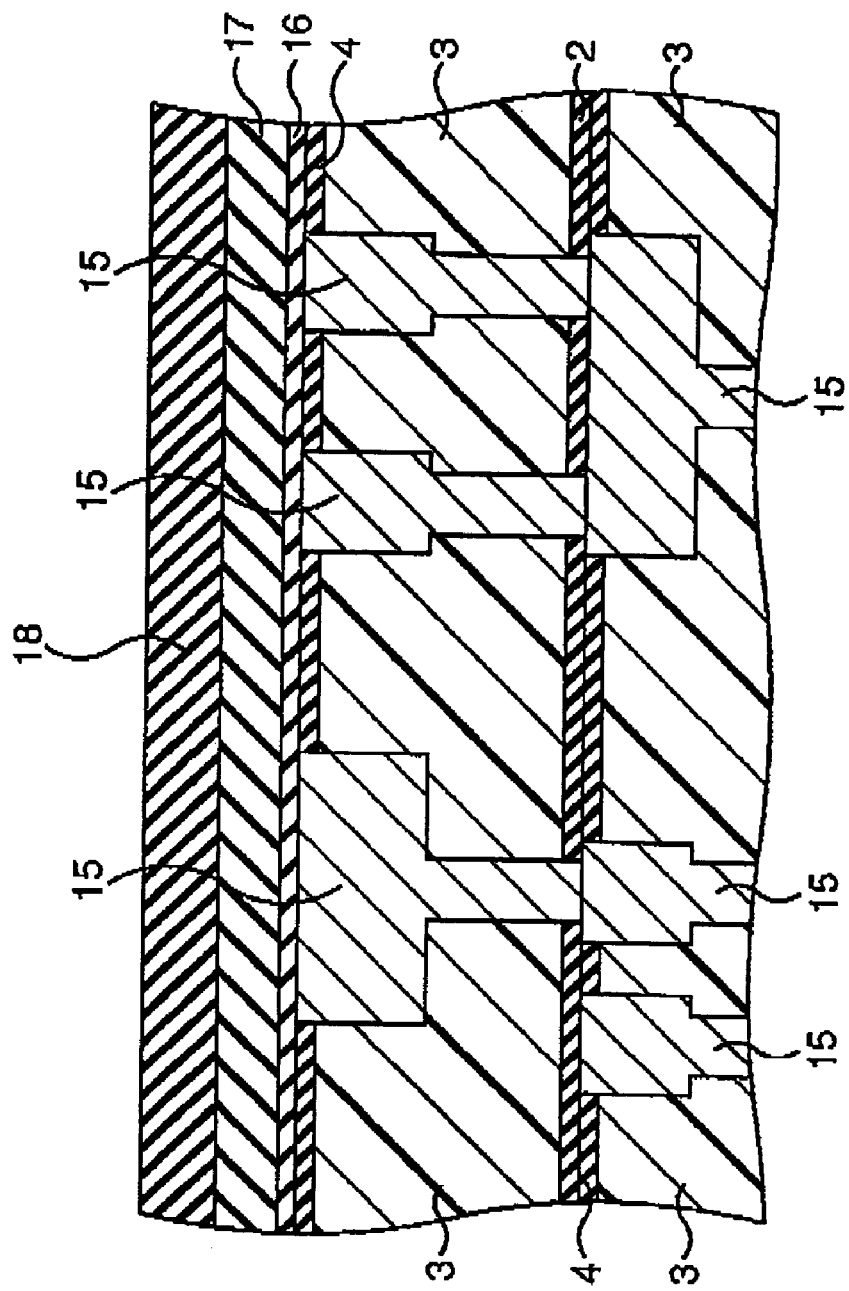
FIG. 2 is a cross-sectional view showing a structure of the semiconductor device manufactured by applying the first embodiment of the present invention.

FIG. 2 is a cross-sectional view showing a structure of the semiconductor device manufactured by applying the embodiment. In an example shown in FIG. 2, at least double layer multilayered wirings are formed according to the manufacturing method relating to the aforementioned embodiment. A passivation layer 16 made from $Si_3N_4$ or the like is formed on the Cu wirings 15 and the organic low dielectric constant film 3 which compose an uppermost layer. Furthermore, a cover film composed of an SiO film 17 and an $Si_3N_4$ film 18 is formed on the passivation layer 16. An opening (not shown) for taking out a pad is accordingly formed in the cover film.

As described above, according to the manufacturing method relating to the embodiment, when the mask for the via hole is formed, a multilayered resist composed of the lower resin film 9, the SOG film 10, and the resist mask 11 is used, and fills the level differences formed on the $Si_3N_4$ film 6, and thereby the photoresist which is the ingredient of the resist mask 11 can be plainly applied. This makes it possible to appropriately transfer the pattern such as reticle or the like on the photoresist, and the resist mask 11 of any desired shape can be obtained. Furthermore, the via hole pattern is formed on the organic low dielectric constant film 3 which is the interlayer dielectric by using the mask on which the pattern of the resist mask 11 is formed. This makes it possible to obtain the via hole 13 and the wiring trench 12 of any appropriate shape.

Here, the depth of the etching of the organic low dielectric constant film 3 is explained. As explained above, when the organic low dielectric constant film 3 is 450 nm thick, it is desirable the organic low dielectric constant film 3 should be etched to the extent of 200 nm to 400 nm before the wiring trench 12 is formed.

When the depth of the etching exceeds 400 nm, it is often the case that the underlying SiC film 2 may be etched when the wiring trench 12 whose depth is approximately 200 nm is formed. Consequently, the Cu wiring 1 directly right below the SiC film 2, on which the via hole pattern is formed, may be damaged. On the other hand, when the depth of the etching is less than 200 nm, it is often the case that the hole may not reach the SiC film 2 even when the wiring trench 12 whose depth is approximately 200 nm is formed. Consequently, there is a possibility of faulty connection due to opening failure. As described above, the depth of the etching is closely related to the damage to the Cu wiring 1 which is a base and the opening failure of the via hole, and for this reason, it is desirable that the depth during this process should be strictly controlled.

Furthermore, according to the embodiment, the lower resin film 9 is removed while the hole in the organic low dielectric constant film 3 is formed, and etching selectivity between the organic low dielectric constant film 3 and the lower resin film 9 is approximately 1. Therefore, it is preferable that the film thickness of the lower resin film 9 should be thinner than that of the organic low dielectric constant film 3 and than the depth of the hole formed in the organic low dielectric constant film 3.

Next, thickness of the hard masks is explained. The lower resin film 9 is formed so as to fill the level differences of the wiring trench patterns formed on the $Si_3N_4$ film 6 which is the hard mask. However, if the level differences of the $Si_3N_4$ film 6 are too large, it is difficult to remove the lower resin film 9, and there is a possibility that the lower resin film 9 may not be completely removed. Accordingly, it is preferable that the film thickness of the $Si_3N_4$ film 6 should be between 30 nm and 100 nm, and for example, approximately 50 nm.

Since the $SiO_2$ film 5 is etched by using the $Si_3N_4$ film 6 during the process shown in FIG. 1J, a margin of etching conditions thereof is small. For example, as described above, if the film thickness of the $Si_3N_4$ film 6 is approximately 50 nm, and if that of the $SiO_2$ film 5 is extremely thicker than 100 nm, there is a possibility that the $Si_3N_4$ film 6 may disappear before completing the etching of the $SiO_2$ film 5. Therefore, the film thickness of the $SiO_2$ film 5 should be preferably between 50 nm and 200 nm, and for example, 100 nm.

Furthermore, the SiC film 4 is removed with the $Si_3N_4$ film 6 during the process shown in FIG. 1K. Therefore, the film thickness of the SiC film 4 should be preferably approximately equal (between 30 nm and 100 nm) with that of the $Si_3N_4$ film 6, for example, approximately 50 nm.

Second Embodiment

Figure 3A:
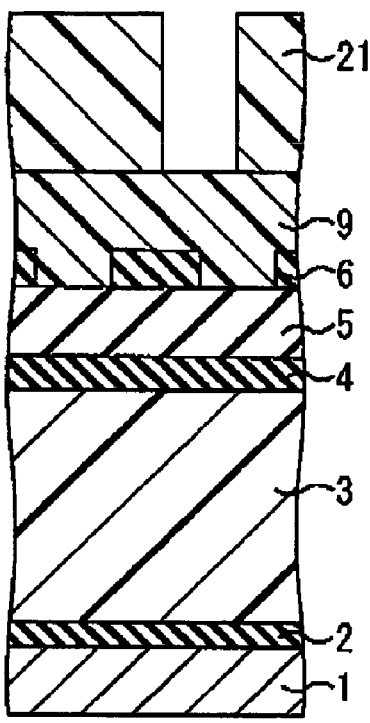
FIG. 3A to FIG. 3C are cross-sectional views showing the method for manufacturing the semiconductor device in order of processes relating to a second embodiment of the present invention.
Figure 3B:
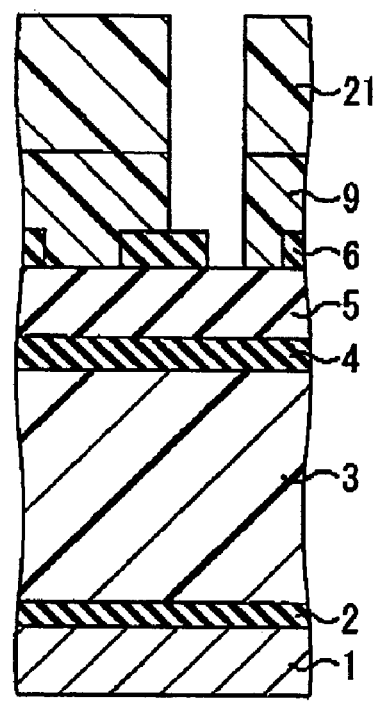
Figure 3C:
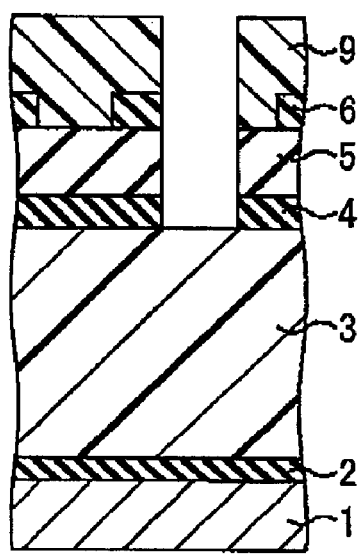

A second embodiment of the present invention is explained hereinafter. FIG. 3A to FIG. 3C are cross-sectional views showing the method for manufacturing the semiconductor device in order of processes relating to the second embodiment of the present invention. The semiconductor device is also manufactured by the trench-first hard mask dual damascene method in this embodiment. However, in this embodiment, a bi-level technology is used for the wiring trench patterns formed on the $Si_3N_4$ film 6 when the via hole pattern is formed, In this embodiment, the processes shown in FIG. 1A to FIG. 1D are first carried out in the same way as the first embodiment.

Then, as shown in FIG. 3A, the lower resin film 9 for filling and planarizing the level differences of the $Si_3N_4$ film 6 is formed. A resist mask (a photoresist layer) 21 on which a via hole pattern is formed is formed by applying an organic photoresist containing Si thereon, exposing and developing it.

Next, as shown in FIG. 3B, the lower resin film 9 is etched by using the resist mask 21 as a mask. This etching is carried out by the plasma etching equipment under the following conditions: for example, $NH_3$: 1–500 sccm, pressure: 0.13–40 Pa (1–300 mTorr), RF power: 100–1000 W, magnetic field: 0.0–10 mT (0–100 G). In this embodiment, since the resist mask 21 contains the Si, the resist mask 21 remains when etching the lower resin film 9.

After this, as can be seen in FIG. 3C, the $Si_3N_4$ film 6, the $SiO_2$ film 5, and the SiC film 4 (the triple layer hard mask) are etched by using the lower resin film 9 as a mask; consequently, a via hole pattern is formed on these films. Simultaneously, the photoresist 21 is removed. This etching is carried out by the plasma etching equipment under the following conditions: for example, $CF_4$: 0–200 scam, Ar: 0–1000 sccm, $O_2$: 0–100 scam, pressure: 0.13–40 Pa (1–300 mTorr), RF power: 100–1000 W, magnetic field: 0–10 mT (0–100 G). The photoresist 21 is simultaneously removed during this etching by adopting a condition that etching selectivity between the photoresist 21 and the triple layer hard mask is approximately 1. Therefore, if a film thickness of the photoresist 21 is extremely thicker than the total film thickness of the triple layer hard mask, the photoresist 21 may remain when completing the etching of the triple layer hard mask. Accordingly, the film thickness of the photoresist 21 should be preferably equal with or below the total film thickness of the $Si_3N_4$ film 6, the $SiO_2$ film 5, and the SiC film 4.

Thereafter, the semiconductor device is completed by carrying out the processes shown in FIG. 1I and after in the same way as the first embodiment.

According to the method for manufacturing the semiconductor device also relating to the embodiment, the via hole and the wiring of any appropriate shape can be obtained in the same way as the first embodiment.

As described above, according to the present invention, since the level differences on the mask for the wiring trench can be embedded by the multilayered resist, a micro pattern can be transferred as designed when forming the mask for the via hole. Therefore, a micro via hole with high precision can be formed, and high reliability can be obtained.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method for manufacturing a semiconductor device for forming a wiring by a dual damascene method, the method comprising the steps of:

forming a mask for a wiring trench patterned to be a wiring trenches pattern on an interlayer dielectric film;

forming a mask for a via hole patterned to be a via holes pattern on the mask for the wiring trench by using a multilayered resist;

forming a hole shallower than a thickness of the interlayer dielectric film in the interlayer dielectric film by processing the interlayer dielectric film, using the mask for the via hole;

forming a wiring trench in the interlayer dielectric film by processing the interlayer dielectric film, using the mask for the wiring trench, and simultaneously forming a via hole by passing the hole through a base layer; and embedding a wiring material in the wiring trench and said via hole, wherein said step of forming the mask for the via hole includes the steps of:

forming an organic film, an inorganic film, and a photoresist layer in this order on the mask for the wiring trench;

processing the photoresist layer so as to be a plane shape to the via hole;

processing the inorganic film so as to be a plane shape to the via hole by using the photoresist layer as a mask; and processing the organic film so as to be a plane shape to the via hole by using the inorganic film as a mask, and simultaneously removing the photoresist layer, and said step of forming the hole includes a step of processing the mask for the wiring trench so as to be a plane shape to the via hole by using the organic film as a mask, and simultaneously removing the inorganic film, and the organic film is removed while forming the hole.

2. The method for manufacturing the semiconductor device according to claim 1, wherein said step of forming the mask for the wiring trench includes the steps of:

forming a first, a second, and a third hard mask in this order on the interlayer dielectric film; and processing the third hard mask so as to be a plane shape to the wiring trench, and wherein the second hard mask is made from a different material from the first and the third hard mask.

3. The method for manufacturing the semiconductor device according to claim 2, wherein each of the first to the third hard mask is made from one kind of inorganic material selected from the group consisting of silicon nitride, silicon dioxide, silicon carbide, amorphous hydrogenated silicon carbide, silicon carbide nitride, organo-silicate glass, silicon rich oxide, tetraethylorthosilicate glass, phosphosilicate glass, organic siloxane polymer, carbon doped silicate glass, hydrogen doped silicate glass, silsesquioxane glass, spin-on glass, and fluorinated silicate glass.

4. The method for manufacturing the semiconductor device according to claim 2, wherein the first hard mask is between 30 nm and 100 nm thick;
the second hard mask is between 50 nm and 200 nm thick; and
the third hard mask is between 30 nm and 100 nm thick.

5. The method for manufacturing the semiconductor device according to claim 1, wherein the interlayer dielectric film is made from an organic material.

6. The method for manufacturing the semiconductor device according to claim 1, wherein a spin-on glass film is formed as the inorganic film.

7. The method for manufacturing the semiconductor device according to claim 1, wherein a thickness of the inorganic film is thinner than a thickness of the mask for the wiring trench.

8. The method for manufacturing the semiconductor device according to claim 1, wherein the organic film is between 100 nm and 400 nm thick;
the inorganic film is between 30 nm and 200 nm thick; and
the photoresist layer is between 100 nm and 300 nm thick, supposing the interlayer dielectric film is between 100 nm and 600 nm thick.

9. The method for manufacturing the semiconductor device according to claim 1, wherein a thickness of the organic film is thinner than that of the interlayer dielectric film.

10. The method for manufacturing the semiconductor device according to claim 1, wherein a film exposed by light at a wavelength of 248 nm, 193 nm, or 157 nm is formed as the photoresist layer.

11. The A method for manufacturing a semiconductor device for forming a wiring by a dual damascene method, the method comprising the steps of:

forming a mask for a wiring trench patterned to be a wiring trenches pattern on an interlayer dielectric film;

forming a mask for a via hole patterned to be a via holes pattern on the mask for the wiring trench by using a multilayered resist;

forming a hole shallower than a thickness of the interlayer dielectric film in the interlayer dielectric film by processing the interlayer dielectric film, using the mask for the via hole;

forming a wiring trench in the interlayer dielectric film by processing the interlayer dielectric film, using the mask for the wiring trench, and simultaneously forming a via hole by passing the hole through a base layer; and embedding a wiring material in the wiring trench and said via hole, wherein said step of forming the mask for the via hole includes the steps of:

forming an organic film and a photoresist layer containing Si in this order on the mask for the wiring trench, processing the photoresist layer so as to be a plane shape to the via hole; and processing the organic film so as to be a plane shape to the via hole by using the photoresist layer as a mask, and said step of forming the hole includes a step of processing the mask for the wiring trench so as to be a plane shape to the via hole by using the organic film as a mask, and simultaneously removing the photoresist, and the organic film is removed while forming the hole.

12. The method for manufacturing the semiconductor device according to claim 11, wherein said step of forming the mask for the wiring trench includes the steps of:

forming a first, a second, and a third hard mask in this order on the interlayer dielectric film; and processing the third hard mask so as to be a plane shape to the wiring trench, and wherein the second hard mask is made from a different material from the first and the third hard mask.

13. The method for manufacturing the semiconductor device according to claim 12, wherein each of the first to the third hard mask is made from one kind of inorganic material selected from the group consisting of silicon nitride, silicon dioxide, silicon carbide, amorphous hydrogenated silicon carbide, silicon carbide nitride, organo-silicate glass, silicon rich oxide, tetraethylorthosilicate glass, phosphosilicate glass, organic siloxane polymer, carbon doped silicate glass, hydrogen doped silicate glass, silsesquioxane glass, spin-on glass, and fluorinated silicate glass.

14. The method for manufacturing the semiconductor device according to claim 12, wherein the first hard mask is between 30 nm and 100 nm thick;
the second hard mask is between 50 nm and 200 nm thick; and
the third hard mask is between 30 nm and 100 nm thick.

15. The method for manufacturing the semiconductor device according to claim 11, wherein The interlayer dielectric film is made from an organic material.

16. The method for manufacturing the semiconductor device according to claim 11, wherein a thickness of the organic film is thinner than that of the interlayer dielectric film.

17. The method for manufacturing the semiconductor device according to claim 11, wherein A film exposed by light at a wavelength of 248 nm, 193 nm, or 157 nm, is formed as the photoresist layer.

* * * * *